(12) United States Patent
Berthold et al.

(10) Patent No.: US 7,110,932 B2
(45) Date of Patent: Sep. 19, 2006

(54) METHOD AND CIRCUIT ARRANGEMENT FOR REGULATING THE OPERATING VOLTAGE OF A DIGITAL CIRCUIT

(75) Inventors: Joerg Berthold, München (DE); Henning Lorch, München (DE)

(73) Assignee: Infineon Technologies AG., Munich (DE)

( * ) Notice: Subject to any disclaimer, the term of this patent is extended or adjusted under 35 U.S.C. 154(b) by 813 days.

(21) Appl. No.: 10/171,121

(22) Filed: Jun. 13, 2002

(65) Prior Publication Data

US 2003/0037307 A1 Feb. 20, 2003

(30) Foreign Application Priority Data

Jun. 13, 2001 (DE) .............................. 101 28 757

(51) Int. Cl.
*G06F 17/50* (2006.01)
*G01R 23/175* (2006.01)
*G01R 13/02* (2006.01)

(52) U.S. Cl. ....................... 703/14; 703/18; 324/76.82; 324/76.54

(58) Field of Classification Search .................. 703/15, 703/19, 14, 18; 375/371, 373; 324/158.1, 324/76.82, 76.54; 714/700; 327/262
See application file for complete search history.

(56) References Cited

U.S. PATENT DOCUMENTS 4,980,586 A * 12/1990 Sullivan et al. ............. 327/262
5,365,463 A * 11/1994 Donath et al. ................ 703/19
5,386,150 A    1/1995 Yonemoto
5,438,259 A *  8/1995 Orihashi et al. ......... 324/158.1

(Continued)

FOREIGN PATENT DOCUMENTS

DE    39 38 459 A1    11/1989

(Continued)

OTHER PUBLICATIONS

Bowman, K.A. et al. "Impact of Die-to-Die and Within-Die Parameter Fluctuations on the Maximum Clock Frequency Distribution." IEEE Int'l Solid-State Circuits Conf., 2001, Feb. 7, 2001. pp. 278-279.*

(Continued)

*Primary Examiner*—Paul L. Rodriguez
*Assistant Examiner*—Ayal Sharon
(74) *Attorney, Agent, or Firm*—Marshall, Gerstein & Borun LLP

(57) ABSTRACT

A method and circuit arrangement for determining performance of a digital circuit to a critical degree by the transit time of signals of the longest signal path, also called the critical path. Since the signal transit time is influenced by the operating voltage, by regulating the operating voltage, to compensate for the effects caused by temperature and process fluctuations on the signal transit time in the digital circuit. In particular, the operating voltage can be regulated as a function of the signal transit time in such a way that a required minimum operating frequency can always be achieved. To determine signal transit time, the digital circuit has associated with it a number of replicas of the critical path in the digital circuit upon which the signal transit time is determined. In order to determine the transit time, the signal path replicas are exposed to the same operating conditions as the digital circuit. Also, to allow a safety margin to be obtained, the signal path replicas have additional circuit elements that further slow down the signal transit times on the signal path replicas. Further, the mean of the transit times on the signal path replicas is determined.

15 Claims, 1 Drawing Sheet

U.S. PATENT DOCUMENTS

| | | | |
|---|---|---|---|
| 5,451,861 A | | 9/1995 | Giebel |
| 5,457,719 A | * | 10/1995 | Guo et al. ............... 375/373 |
| 5,845,109 A | * | 12/1998 | Suzuki et al. ............. 713/401 |
| 5,870,404 A | * | 2/1999 | Ferraiolo et al. .......... 714/700 |
| 6,313,622 B1 | * | 11/2001 | Seki et al. ............. 324/76.82 |
| 6,477,659 B1 | * | 11/2002 | Ho ........................... 713/503 |
| 6,535,735 B1 | * | 3/2003 | Underbrink et al. ....... 323/283 |
| 2004/0019450 A1 | * | 1/2004 | Berthold et al. ........... 702/117 |

FOREIGN PATENT DOCUMENTS

| | | |
|---|---|---|
| DE | 42 33 850 C1 | 10/1992 |
| DE | 692 24 270 T2 | 11/1992 |
| JP | 60041892 A * | 3/1985 |

OTHER PUBLICATIONS

Bowman, K.A. et al. "Impact of Extrinsic and Intrinsic Parameter Fluctuations on CMOS-circuit Performance." IEEE Journal of Solid State Circuits. vol. 35, Issue 8, pp. 1186-1193.*

Carley, L.R. and A. Agrawal. "A Completely On-Chip Voltage Regulation Technique for Low Power Digital Circuits." Proc. 1999 Int'l Symposium on Low Power Electronics and Design (ISLPED '99). 1999. pp. 109-111.*

Dragone, N. et al. "An Adaptive On-Chip Voltage Regulation Technique for Low-Power Applications." Proc. of the 2000 Int'l Symposium on Low Power Electronics and Design (ISLPED '00). 2000. pp. 20-24.*

\* cited by examiner

METHOD AND CIRCUIT ARRANGEMENT FOR REGULATING THE OPERATING VOLTAGE OF A DIGITAL CIRCUIT

BACKGROUND

The present invention relates to a method of determining an indicator of a signal transit time in a digital circuit, to a method of regulating the operating voltage of a digital circuit, and to a circuit arrangement for regulating the operating voltage of a digital circuit.

The performance of a digital circuit is determined to a critical degree by the transit time of signals in its circuit elements. If the signals in the digital circuit can pass through the circuit elements in a short transit time, or in other words, quickly, then the circuit can be operated at a higher frequency and, hence, with a higher performance. In particular, what determines performance in this case is the transit time for the longest signal path, also termed the critical path. The number of critical paths in a digital circuit may range from one to several thousand, the latter being the case in for example circuits which process a large number of bits in parallel and/or have many pipeline stages. The maximum operating frequency for synchronous, clocked digital circuits is then equal to the reciprocal of the transit time for the longest signal path.

Due to temperature-related effects, voltage fluctuations and production-related factors, the signal transit time on the critical signal path is not precisely known. Thus, a safety margin is normally introduced. This safety margin lays down a maximum permitted operating frequency equal to the reciprocal of a maximum transit time, where the maximum transit time is the sum of the signal transit time on the critical path and of other maximum increases in transit time which may arise from the temperature variations or voltage fluctuations or production-related factors that can be expected. In this way, the increase in transit time due to the effect of temperature is determined by the temperature range specified, which may extend from −20° C. to +100° C. for example. The increase in transit time due to the supply voltage represents the effect of the sporadic variation in the supply voltage. If the supply voltage is varied, the signal transit times alter, with a higher voltage giving shorter transit times and a lower voltage longer ones.

By using a suitable detection circuit for the digital circuit and for the current temperature to determine the transit time on the critical path, it is possible to make use of the dependence which signal transit time has on the operating voltage to set the maximum transit time. The effects caused by temperature and process fluctuations on transit time on the critical path are compensated for in this way. If, for example, the circuit is operated at ambient temperature and the circuit elements of the digital circuit have a short signal transit time, then even quite a low supply voltage will be enough to allow the required frequency to be achieved. The power consumption of the circuit is thus lower, which is desirable particularly in portable applications.

To allow a digital circuit to be operated with as low an operating voltage as possible, it is known for the digital circuit to have assigned to it an auxiliary circuit providing a simulation or so called replica of a critical path. If the signal transit time on this critical path exceeds a given value, the supply voltage is raised. If the signal transit time drops below a set value, it is lowered. The particular disadvantage that this known method has is that if there are major fluctuations in the transit times in the individual circuit elements there may be too great a difference between the signal transit time on the replica of the critical path and the signal transit time in the digital circuit, which means that regulating the operating voltage by reference to the signal transit time in the replica may give rise to unacceptably high signal transit times in the digital circuit. To counter this, provision may be made for an increasing safety margin as the fluctuation in the signal transit times in the circuit elements increases, but this has the disadvantageous consequence that an unnecessarily high operating voltage may be set in certain circumstances. When this is done, the statistical fluctuations in gate transit time increase for semiconductor structures of the same dimensions, and it is thus precisely with modern-day CMOS technologies and high-performance circuits, where the operating frequency may be more than 1 GHz, that the operating voltage can, at best, only be regulated by the known method by accepting the disadvantage of an excessively high operating voltage.

SUMMARY

According to a disclosed example, a method of determining an indicator of a signal transit time in a digital circuit is provided by use of an auxiliary circuit associated with and simulating the digital circuit, the auxiliary circuit having at least two replicas of a signal path in the digital circuit made up of circuit elements connected in series, wherein mean signal transit times in the circuit elements of a signal path replicas bear a known relationship to mean signal transit times in circuit elements of a signal path of the digital circuit that is simulated. The method includes first subjecting the signal path replicas and the digital circuit to the same operating conditions. A mean of the signal transit times on the signal path replicas is then determined. Finally, the mean plus an added temporal safety margin is set as the indicator of the signal transit time in the digital circuit.

According to another disclosed example, a method is provided for regulating an operating voltage of a digital circuit having an associated auxiliary circuit with at least two replicas of a signal path in the digital circuit, the at least two replicas comprising circuit elements connected in series and wherein a mean signal transit time in the circuit elements of the signal path replicas bear a known relationship to a mean signal transit time in the circuit elements on the signal path of the digital circuit that is simulated. The method includes subjecting the at least two signal path replicas and the digital circuit to the same operating conditions. The mean of the signal transit times on the signal path replicas is then determined. Next, a temporal safety margin is added to the mean of the signal transit times. Finally, the operating voltage is regulated such that the mean plus the temporal safety margin is below a limiting value.

According to yet another disclosed example, a circuit arrangement is provided that includes a digital circuit having an auxiliary circuit simulating a signal path of the digital circuit. The auxiliary circuit has at least two replicas of a signal path in the digital circuit that are each made up of circuit elements connected in series. The circuit arrangement is configured such that the signal path replicas and the digital circuit are subject to the same operating conditions and a mean signal transit time in the circuit elements of the signal path replicas bear a known relationship to a mean signal transit time in the signal path of the digital circuit that is simulated. Also included is a regulating device configured to determine the mean of the signal transit time on the signal path replicas and regulate an operating voltage in such a way that a sum of the mean determined for the signal transit times on the signal path replicas and a temporal safety margin is below a limiting value.

DETAILED DESCRIPTION OF THE PREFERRED EXAMPLES

Figure 1:
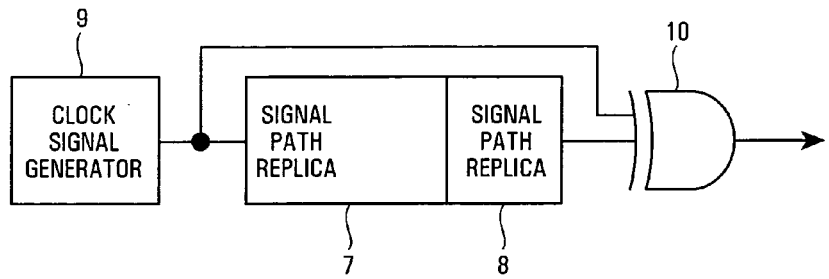
FIG. 1 shows a circuit arrangement for determining a signal transit time on a signal path.

FIG. 1 shows an auxiliary circuit for determining an indicator or simulation of the signal transit time in a digital circuit. This auxiliary circuit has signal path replicas 7, 8 which are connected in parallel into a block so that they have only one input and one output. Connected to the input of the signal path replicas 7, 8 is a clock signal generator 9 which generates a clock signal at the operating frequency of the digital circuit. The output of the signal path replicas 7, 8 is connected to one input of an exclusive OR gate 10 whose other input is connected to clock signal generator 9. The output of XOR gate 10 is only high if the signals applied to the two inputs are different. If signal path replicas 7, 8 have a signal transit time of zero (0), for example, the signals applied to the two inputs of XOR gate 10 are always the same and the output thus remains low. To the degree that the signal transit time on signal path replicas 7, 8 rises, the output signal from signal path replicas 7, 8 is delayed relative to the clock signal from clock signal generator 9 and the periods of time for which different signals are present at the inputs of XOR gate 10 become longer. Therefore, a square-wave signal is present at the output of XOR gate 10 and the lengths of the pulses in this signal rise as the signal transit time on signal path replicas 7, 8 increases.

Together with a digital circuit (not shown), the auxiliary circuit shown in FIG. 1 is integrated into a common semiconductor and is connected to the same supply voltage. This ensures that the signal transit times in the circuit elements of both the digital circuit and the signal path replicas 7, 8 are subject to the same influences caused by operating voltage, manufacture and temperature. Hence, the signal transit times in the circuit elements on the signal path replicas 7, 8 are substantially the same as the signal transit times in the circuit elements in the digital circuit, with the means, in particular, of the transit times being the same in each case. In this way, by determining the signal transit time on the signal path replicas 7, 8 it is possible to draw sufficiently safe conclusions as to the signal transit times in the digital circuit.

Connected to the output of XOR gate 10 is a regulating device (not shown). The regulating device, which, by reference to the output signal from XOR gate 10, which is an indication of the signal transit time on the signal path replicas 7, 8 and in the digital circuit, regulates the operating voltage of the digital circuit, and hence of the signal path replicas 7, 8 too, in such a way that the signal transit time on signal path replicas 7, 8 does not exceed a given limiting value.

The signal path replicas 7, 8 first have replicas 7 that represent a critical path in the digital circuit. The signal transit time found with the help of the replica 7 of a critical path is therefore equal, at least theoretically, to the highest signal transit time which occurs in the digital circuit. Due to the considerably larger number of critical paths in the digital circuit and the possibility which cannot be ruled out of statistical fluctuation in the transit times of the various circuit elements, it can never be ruled out that longer signal transit times may occur in the digital circuit than on the replica 7 of the critical path, and because of this the signal path replicas 7, 8 have additional circuit elements in signal path replica 8 connected in series which lengthen the signal transit time on the signal path replicas 7, 8 to an additional degree. In this way, what is determined by the auxiliary circuit shown in FIG. 1 is a signal transit time which, with a certain probability, is higher by a given safety margin than the longest signal transit time which occurs in the digital circuit, the safety margin being determined by the number of circuit elements in the circuit path replica 8 which are connected in series in the given case and the signal transit times in them.

The safety margin required to allow the required operating frequency to be achieved is specified as standard deviations for the path transit time, in which case allowance must be made for the statistical fluctuation in the signal transit times in the circuit elements. If, for example, the statistical fluctuation in the signal transit time is 15% and there is to be at least a 95% probability of the maximum signal transit time determined for the critical path not being too small, the safety margin in terms of standard deviations of the path transit time must be one of the following values:

| Number of paths | Number of standard deviations of the path transit time |
| --- | --- |
| 1 | 1.65 |
| 10 | 2.55 |
| $10^2$ | 3.33 |
| $10^3$ | 3.9 |
| $10^4$ | 4.4 |
| $10^5$ | 4.9 |
| $10^6$ | 5.32 |
| $10^7$ | 5.73 |

The additional circuit elements of signal path replica 8 of the signal path replicas 7, 8 are selected in such a way that the requisite safety margin can be obtained with them as a function of the number of critical paths and the statistical fluctuation in the signal transit times in the circuit elements.

Figure 2:
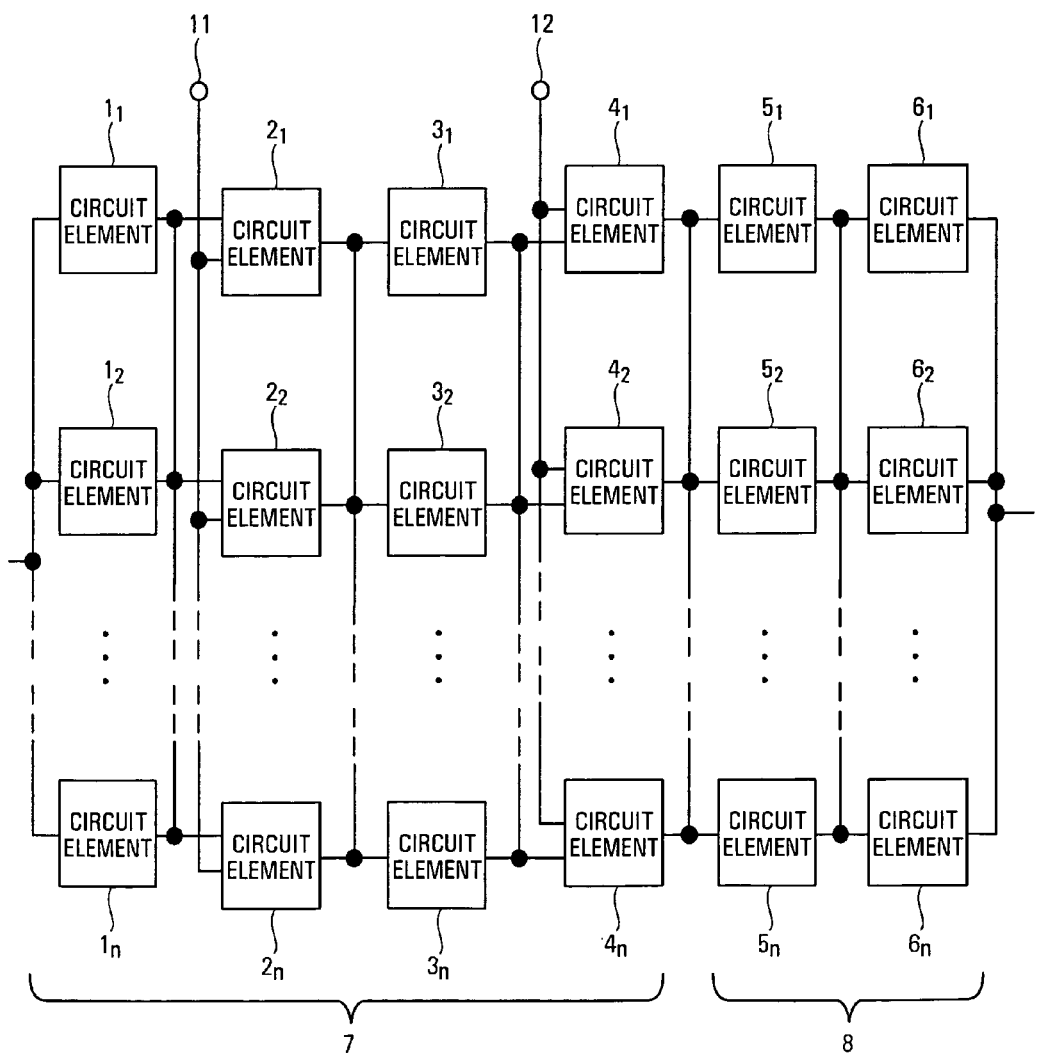
FIG. 2 shows the construction of a plurality of signal path replicas connected in parallel.

FIG. 2 shows the construction of the signal path replicas 7, 8 in detail. Each particular signal path replica comprises a string of circuit elements $1_x$–$6_x$ that are connected in series. Of the signal path replicas that are present only three are shown by way of example and the total "n" number of signal path replicas may be between 10 and 20, for example.

To enable the mean of the signal transit times on the signal path replicas to be determined easily, the signal path replicas are connected in parallel. For this purpose the inputs of the signal path replicas or, more particularly, the inputs of the circuit elements $1_x$, which are first in each signal path replica, are connected together and form the input to the signal path replicas 7, 8. The outputs of the circuit elements $6_x$, which are last in each signal path replica, are likewise connected together and form the output of the signal path replicas 7, 8.

Furthermore, the outputs of the remaining circuit elements $1_x$–$5_x$ situated at the same points in the signal path replicas 7, 8 are connected together, i.e., in parallel. In this way, signal path replicas 7, 8 comprise a series connection of circuit elements $1_x$–$6_x$ each connected in parallel, in which case circuit elements $1_x$–$4_x$, in particular, each represent the critical path in the digital circuit in the present example and circuit elements $5_x$, $6_x$, in particular, are provided as additional circuit elements comprising signal path replica 8 to provide the requisite safety margin. The numbers subscripted to the reference numerals of the circuit elements $1_x$–$6_x$ on the signal path replicas 7, 8 each indicate the signal path replica to which the circuit element in question belongs.

The second and fourth circuit elements $2_x$ and $4_x$ have two inputs, only one of which however is connected to the output of the preceding circuit elements $1_x$ and $3_x$ respectively. To ensure that the signal is passed on, those signal inputs of the two circuit elements $2_x$ and $4_x$ on the different signal path replicas, which are free in the respective cases, are connected in parallel and provided with respective connections 11 and 12. Steady signals are connected to the two connections 11, 12 which make it possible for circuit elements $2_x$ and $4_x$ to pass on the signal from the respective preceding circuit elements $1_x$ and $3_x$. The steady signals applied to connections 11 and 12 will depend on the nature of the respective circuit elements $2_x$ and $4_x$.

The disclosed method and circuit arrangement for regulating the operating voltage of a digital circuit and determining an indicator of the signal transit time in the digital circuit allow high accuracy to be achieved even when there are large fluctuations in the signal transit times in the individual circuit elements, such that there is no need for, in particular, the operating voltage to be set at an unnecessarily high level.

In the disclosed method, in particular, an exact indication of the signal transit time in the digital circuit can be reliably obtained even with a relatively small number of replicas. Once the signal transit times in the circuit elements show a substantially normal distribution, an effect comes into play whereby the mean even for a relatively small number of replicas comes very close to the mean for a very large number of signal paths and in particular of critical signal paths. In this way, the signal transit time in the digital circuit can therefore be determined reliably even with a small number of replicas or, in other words, at low cost and complication.

As described above, the signal-path replicas are advantageously integrated into the same semiconductor as the digital circuit, which means that it can be associated with the digital circuit at low cost and complication and that it is ensured that it has the same properties and is exposed to the same operating conditions, i.e., the same temperature and the same voltage. Also, the mean of the signal transit times on the signal path replicas is advantageously determined by connecting the individual replicas in parallel and considering them to be a single signal path. If the signal transit time on this single signal path is then determined, it corresponds with a high degree of accuracy to the mean of the transit times on the individual signal path replicas. By replica exercises it has been shown that the transit time on a single signal path of this kind or in circuit elements connected in parallel depends to only a very small degree on the range of distribution of the signal transit times. In particular, extreme deviations do not have any effect because it is the majority of circuit elements that determine the switching point and hence the signal transit time. The signal path replicas can be connected in parallel in a variety of ways in this case. It is, for example, possible for only the inputs and the outputs of the individual signal path replicas to be connected in parallel or in other words connected together. However, it is also possible for those inputs and outputs of circuit elements which are situated at the same points in the different signal path replicas to be connected together. In this way, not only are the signal path replicas connected in parallel but so too are individual components or circuit elements of the signal path replicas. In particular, it is possible in this case even for all the circuit elements to be connected together or in other words for the outputs of all the circuit elements which are situated at the same points in the different signal path replicas to be connected together, thus enabling signal path replicas connected in this way also to be looked upon as series circuits composed of circuit elements connected in parallel.

As was also described, in order to obtain a safety margin when determining the indicator of the signal transit time in the digital circuit or when regulating the operating voltage for the digital circuit, the signal path replicas may each have additional circuit elements connected in series, which further lengthen the signal transit times on the signal path replicas. In this way the signal transit time that is determined is higher than in the digital circuit. If it is this transit time that is used to regulate the operating voltage, the operating voltage is regulated to a value that is higher, by a safety margin, than the value required to achieve the intended operating frequency. Additional circuit elements of this kind on the signal path replicas may, for example, be used to allow for the number of critical paths in the digital circuit. If the number of critical paths in the digital circuit goes up, so too does the probability of there being signal transit times which are extended in comparison with the mean. Statistical methods can be used in this case to determine the maximum transit time on the critical path in a digital circuit. It can, for example, be determined how large the safety margin needs to be for standard deviations of the path transit time, so that there will be a preset probability of no path in the digital circuit having a signal transit time longer than this.

Further, by means of the additional circuit elements in the signal path replicas it is also possible for allowance to be made for the statistical fluctuations in the circuit elements. If, for example, the statistical fluctuation becomes higher, there is also a rise in the risk of signal transit times which are a long way above the mean, which means that a larger safety margin is needed so that there will be a given probability of no value which is too low being found for signal transit time in the digital circuit.

The circuit elements in the digital circuit or the signal path replicas may, for example, even be gates that may have a plurality of inputs. To allow a simple signal chain with no branches to be obtained for the signal path replicas, where there are circuit elements having a plurality of inputs, it is only one input at any given time that is used to build the signal path replica, the other inputs having a steady signal applied to them in such a way that it is the signal applied to the circuit element input in use which is passed on. If the circuit elements are AND gates, for example, the unused inputs are set to High to ensure that the signal at the input in use is passed on.

With the help of the solution according to the disclosed example, it is possible to obtain an indication of the signal transit time in a digital circuit by means of a replica of a critical path in the digital circuit, with only a low degree of cost and complication, i.e., a small number of signal path replicas being required for the replica of the signal path.

Although certain methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A method of determining an indicator of a signal transit time in a digital circuit by use of an auxiliary circuit associated with and simulating the digital circuit, the auxiliary circuit having at least two replicas of a signal path in the digital circuit made up of circuit elements connected in series, wherein mean signal transit times in the circuit elements of a signal path replicas bear a known relationship to mean signal transit times in circuit elements of a signal path of the digital circuit that is simulated, and wherein the at least two signal path replicas and the digital circuit are connected to the same supply voltage, the method comprising:

subjecting the signal path replicas and the digital circuit to the same operating conditions;

determining a mean of the signal transit times on the signal path replicas; and setting the mean plus an added temporal safety margin as the indicator of the signal transit time in the digital circuit.

2. A method according to claim 1, wherein the signal path in the digital circuit that is simulated by the auxiliary circuit is at least one of a critical path in the digital circuit and a signal path of the greatest length that occurs in the digital circuit.

3. A method according to claim 1, wherein the signal path replicas each have additional circuit elements connected in series, the additional circuit elements being configured to lengthen the signal transit time of the signal path replicas by an amount that is determined as a function of at least one of a number of critical paths existing in the digital circuit and signal paths of the greatest length occurring in the digital circuit.

4. A method according to claim 1, wherein the signal path replicas each have additional circuit elements connected in series, the additional circuit elements configured to lengthen the signal transit time on the signal path replicas by an amount that is determined as a function of a statistical fluctuation in the signal transit time in the circuit elements in the digital circuit.

5. A method for regulating an operating voltage of a digital circuit having an associated auxiliary circuit with at least two replicas of a signal path in the digital circuit, the at least two replicas comprising circuit elements connected in series and wherein a mean signal transit time in the circuit elements of the signal path replicas bear a known relationship to a mean signal transit time in the circuit elements on the signal path of the digital circuit that is simulated, and wherein the at least two signal path replicas and the digital circuit are connected to the same supply voltage, the method comprising:
 subjecting the at least two signal path replicas and the digital circuit to the same operating conditions;
 determining the mean of the signal transit times on the signal path replicas;
 adding a temporal safety margin to the mean of the signal transit times; and
 regulating the operating voltage such that the mean plus the temporal safety margin is below a limiting value.

6. A method according to claim 5, wherein the signal path in the digital circuit that is simulated by the auxiliary circuit is at least one of a critical path in the digital circuit and a signal path of the greatest length that occurs in the digital circuit.

7. A method according to claim 5, wherein the signal path replicas each have additional circuit elements connected in series, the additional circuit elements being configured to lengthen the signal transit time of the signal path replicas by an amount that is determined as a function of at least one of a number of critical paths existing in the digital circuit and signal paths of the greatest length occurring in the digital circuit.

8. A method according to claim 5, wherein the signal path replicas each have additional circuit elements connected in series, the additional circuit elements configured to lengthen the signal transit time on the signal path replicas by an amount that is determined as a function of a statistical fluctuation in the signal transit time in the circuit elements in the digital circuit.

9. A circuit arrangement comprising:
 a digital circuit having an auxiliary circuit simulating a signal path of the digital circuit, the auxiliary circuit having at least two replicas of a signal path in the digital circuit that are each made up of circuit elements connected in series, wherein the circuit arrangement is configured such that the signal path replicas and the digital circuit are subject to the same operating conditions and are connected to the same supply voltage, and that a mean signal transit time in the circuit elements of the signal path replicas bear a known relationship to a mean signal transit time in the signal path of the digital circuit that is simulated; and
 a regulating device configured to determine the mean of the signal transit time on the signal path replicas and regulate an operating voltage in such a way that a sum of the mean determined for the signal transit times on the signal path replicas and a temporal safety margin is below a limiting value.

10. A circuit arrangement according to claim 9, wherein the digital circuit and the auxiliary circuit are integrated together into a semiconductor.

11. A circuit arrangement according to claim 9, wherein inputs of the signal path replicas and outputs of circuit elements that are arranged in last positions on the signal path replicas are respectively connected together and the regulating device is further configured to determine the mean of the signal transit times on the signal path replicas by determining the signal transit time between the inputs of the signal path replicas, which are connected in parallel, and the outputs of the circuit elements arranged in last positions on the signal path replicas, which are connected in parallel.

12. A circuit arrangement according to claim 11, wherein the outputs of all the circuit elements are arranged at same points within the signal path replicas are connected together.

13. A circuit arrangement according to claim 9, wherein the signal path in the digital circuit that is simulated is at least one of a critical signal path in the digital circuit and a signal path of the greatest length which occurs in the digital circuit.

14. A circuit arrangement according to claim 9, wherein the signal path replicas each have additional circuit elements connected in series, the additional circuit elements configured to lengthen the signal transit time on the signal path replicas by an amount that is determined as a function of at least one of the number of critical paths and signal paths of the greatest length occurring in the digital circuit.

15. A circuit arrangement according to claim 9, wherein the signal path replicas each have additional circuit elements connected in series, the additional circuit elements configured to lengthen the signal transit time of the replicas by an amount that is determined as a function of a statistical fluctuation in the signal transit times in the circuit elements in the digital circuit.

* * * * *